United States Patent
Liu

(10) Patent No.: US 7,138,816 B2
(45) Date of Patent: Nov. 21, 2006

(54) ON-DIE MONITORING DEVICE POWER GRID

(75) Inventor: Jonathan H. Liu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 67 days.

(21) Appl. No.: 10/974,057

(22) Filed: Oct. 26, 2004

(65) Prior Publication Data

US 2006/0109019 A1    May 25, 2006

(51) Int. Cl.
G01R 31/02    (2006.01)
(52) U.S. Cl. .................................. 324/763; 324/765
(58) Field of Classification Search ............... None
See application file for complete search history.

(56) References Cited

U.S. PATENT DOCUMENTS

| | | | | |
|---|---|---|---|---|
| 5,673,058 A | * | 9/1997 | Uragami et al. ............ 345/3.1 |
| 6,172,546 B1 | * | 1/2001 | Liu et al. .................... 327/286 |
| 6,175,928 B1 | * | 1/2001 | Liu et al. .................... 713/401 |
| 6,842,027 B1 | * | 1/2005 | Liu et al. .................... 324/763 |
| 6,882,238 B1 | * | 4/2005 | Kurd et al. .................. 331/186 |
| 7,038,480 B1 | * | 5/2006 | Liu et al. .................... 324/763 |

FOREIGN PATENT DOCUMENTS

JP    05275184 A    * 10/1993

* cited by examiner

*Primary Examiner*—Jermele Hollington
(74) *Attorney, Agent, or Firm*—Blakely, Sokoloff, Taylor & Zafman LLP

(57) ABSTRACT

An embodiment of the present invention is a technique to monitor on-die device power grid. A sensor circuit generates a ground reference (GR) signal and N power reference (PR) signals forming a ladder according to a programmable configuration. The GR signal tracks a device ground signal of a device and the PR signals track a device power signal of the device. A comparator circuit compares the GR signal with the N PR signals to provide N comparison output signals, the N comparison output signals indicating position and time that the GR reference signal moves across the ladder.

30 Claims, 15 Drawing Sheets

ON-DIE MONITORING DEVICE POWER GRID

BACKGROUND

1. Field of the Invention

Embodiments of the invention relate to the field of microprocessors, and more specifically, to on-die monitoring.

2. Description of Related Art

As microprocessor architecture becomes more and more complex to support high performance applications, circuit design of high frequency devices has become a challenge. To facilitate the testing and verification of circuits, it is useful to be able to observe or monitor switching phenomena in the presence of alternating current (AC) and direct current (DC) noises.

Existing techniques to address the problem of device monitoring have a number of disadvantages. One technique calls for probing the device by inserting probes at various test points. This technique is intrusive because it requires the device to be opened and exposed to the environment. It is tedious, cumbersome, and not flexible to accommodate different device processes. Other techniques may provide signals indicating if a certain threshold has been exceeded. These techniques do not provide useful information regarding the nature of the problem and the quantification of the parameters of interest.

BRIEF DESCRIPTION OF THE DRAWINGS

The embodiments of invention may best be understood by referring to the following description and accompanying drawings that are used to illustrate embodiments of the invention. In the drawings.

DESCRIPTION

An embodiment of the present invention is a technique to monitor an on-die device power grid. A sensor circuit generates at least one ground reference (GR) signal and N power reference (PR) signals forming a ladder according to a programmable configuration. The GR signal tracks a device ground signal of a device and the PR signals track a device power signal of the device. A comparator circuit compares the GR signal with the N PR signals to provide N comparison output signals, the N comparison output signals indicating position and time that the GR reference signal moves across the ladder. Another embodiment may have at least one PR, and N GR signals forming a ladder.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention is a technique to provide on-die oscilloscope capability. The technique can be used for circuit debugging, test vector validation in a tester environment, in-system power monitoring, and in-system user condition device power grid monitoring.

Figure 1:
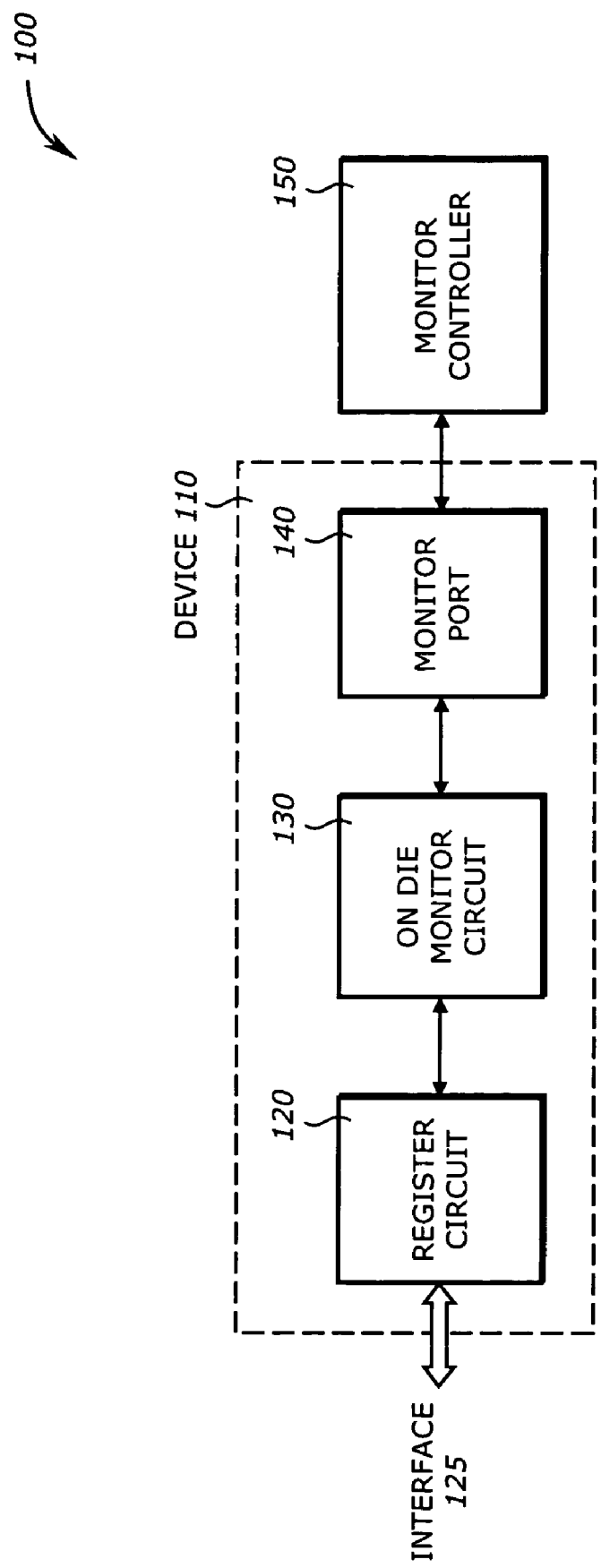
FIG. 1 is a diagram illustrating a system in which one embodiment of the invention can be practiced.

FIG. 1 is a diagram illustrating a system 100 in which one embodiment of the invention can be practiced. The system 100 includes a device 110 and a monitor controller 150.

The device 110 is any semiconductor device that provides on-die monitoring capability. It may be a microprocessor, a microcontroller, a digital signal processor, a processor chipset, a memory device, a peripheral device, a network controller, an input/output (I/O) device, a communication device, a media (e.g., audio, video, imaging, graphics) processor, etc. Typically, the device 110 is a high frequency device. It includes a register circuit 120, at least one on-die monitor circuit 130, and an optional monitor port 140 in additional to other circuits.

The register circuit 120 is the circuit contains the operating settings for the device 110. The register circuit 120 can also contain measurement result of the on die monitor circuit 130. The register circuit 120 can be written and read by software via the interface 125. The interface 125 is any interface that allows software to write to or read from the register circuit 120. The register circuit 120 may also be controlled and accessed from monitor port 140. The register circuit 120 typically operates from a power source and has at least a device power signal (e.g., $V_{CC}$) and a device ground signal (e.g., $V_{SS}$).

The on-die monitor circuit 130 is included in the device 110 but may not be involved in its normal functions. The on-die monitor circuit 130 may not affect the operations of the device 110. It is used to provide an effective and flexible means to monitor, observe, quantify, and record AC and DC phenomena involving the power grid used by the device 110. The on-die monitor circuit 130 may provide useful information regarding the power characteristics of the device 110 such as the difference between the AC and DC power and ground ($V_{cc}-V_{ss}$). It may detect the maximum and minimum of this difference. It may also detect AC noise frequency and noise amplitude and the slew rates of these parameters. It may track these parameters as functions of time. This information is useful to identify, analyze, and characterize potential power grid performance problems. In essence, the on-die monitor circuit 130 acts like an on-die oscilloscope to provide signals that can be captured, observed, or visualized. The on-die monitor circuit 130 may operate within the frequency range of the device 110. In one embodiment, this frequency range is from DC to several Giga Hertz (GHz). The on-die monitor circuit 130 may be dependent on process, voltage, and temperature (PVT), and can be calibrated to take into account the process variations for each device. The device 110 may contain multiple on-die monitor circuits 130 at various locations inside the device 110 to monitor various power domains at various voltage levels in the device 110.

The monitor port 140 is an interface to provide access to and from the on-die monitor circuit. It may be an I/O port with proper buffering and driving capabilities. It may be a parallel port, a serial port, or a storage element. It typically latches or passes through the monitor information or data provided by the on-die monitor circuit 130. It also captures the command data or program information from the monitor controller 150. The monitor port 140 may also provide a direct monitor or access capability for the device 110. Different on-die monitor circuits 130 in the device 110 can share the same monitor port 140. The monitor port 140 can be made optional, since the on die monitor circuit 130 can also be solely controlled and accessed by the register circuit 120. The register circuit 120 may also be controlled by software.

The monitor controller 150 is an external device or module to interface with the on-die monitor circuit 130 via the monitor port 140. It may be a logic analyzer, a test fixture, a monitor module, a programmable controller, etc. It may control the monitoring of power behavior of the device 110. The power behavior may include the sensitivity of the difference between the power (Vcc) and ground (Vss) of the device 110 with respect to AC and DC phenomena such as AC overshoot and undershoot, and voltage drop. It may have software or program to provide command data to configure or set up the on-die monitor circuit 130, and to read or obtain the status or monitor information provided by the on-die monitor circuit 130. It may also be used to calibrate the on-die monitor circuit 130 to compensate for or take into account process variations. It may also contain programs to emulate or simulate the monitoring functions performed by the monitor circuit 130. It may have graphical capability to present the observed signals in graphical form as in an oscilloscope. The software or programs in the monitor controller 150 may be contained in a machine accessible medium as described above.

Figure 2:
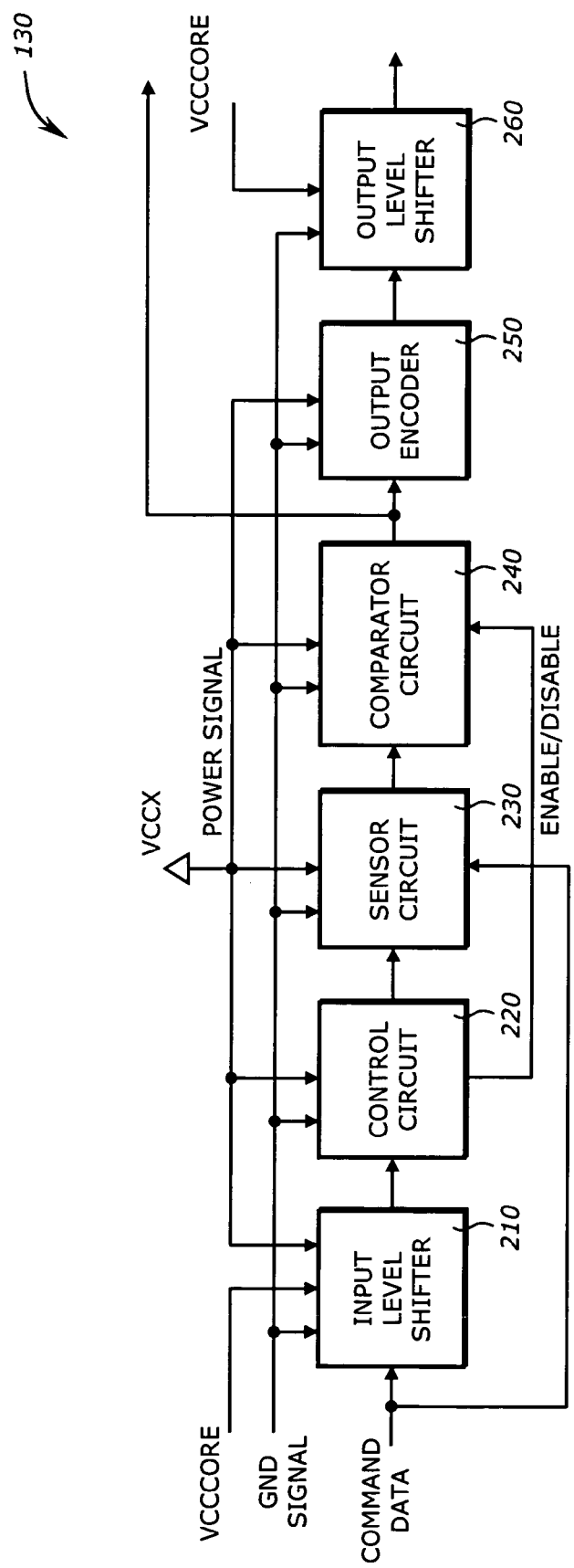
FIG. 2 is a diagram illustrating an on-die monitor circuit according to one embodiment of the invention.

FIG. 2 is a diagram illustrating the on-die monitor circuit 130 according to one embodiment of the invention. The monitor circuit 130 includes an optional input level shifter 210, a control circuit 220, a sensor circuit 230, a comparator circuit 240, an optional output encoder 250, and an optional output level shifter 260. Note that the monitor circuit 130 may include more or less than the above components depending on the device characteristics and requirements.

The input level shifter 210 and the output level shifter 260 typically bridge the power supply of the core circuit 120 ($V_{cccore}$) and the monitored power signal (Vccx). The control circuit 220, the sensor circuit 230, the comparator circuit 240, and the output encoder 250 typically operate at a separate power supply ($V_{ccx}$). If these two power supplies are identical, they can be tied together. Typically, all of these components operate from the same device ground signal. The Vccx power supply is the device power signal to be monitored by the monitor circuit 130.

The monitor circuit 130 typically receives command signals from the monitor controller 150, registers in the device 110, or logic signals applied at the monitor port 140. The command signals may be encoded to represent various operational modes for the monitor circuit 130. The operational modes include a combination of various circuit operation such as observing DC parameters, observing low and high frequency noises, enable/disable latches, set ground reference (GR) signal with respect to power reference (PR) ladder, modifying ladder resolution and range, etc. In one embodiment, the command signals from a 3-bit code CMD [0:2 ] as follows:

000: Disable. In this mode, the monitor circuit 130 is disabled. No information is available.
001: Enable. Observe DC and low frequency noise with lower GR signal position.
010: Enable. Observe DC and high frequency noise with latch enabled for undershoot noise and default GR signal position.
011: Enable. Observe DC and high frequency noise with latch enabled for overshoot noise and default GR signal position.
100: Enable. Observe DC and low frequency noise with default ground reference (GR) signal position.
101: Enable. Observe DC and low frequency noise with higher GR signal position.
110: Enable. Observe DC and high frequency noise with latch enabled for undershoot noise with lower GR signal position for $V_{ccmin}$ search.
111: Enable. Observe DC and high frequency noise with latch enabled for overshoot noise with higher GR signal position for $V_{ccmax}$ search.

The above command codes are only for illustrative purposes. As is known by one skilled in the art, other command codes may be defined and the number of bits for the command codes may be more or less than three.

The input level shifter 210 shifts the voltage level of the command signals provided by the monitor controller 150, or registers in device 110, or from the monitor port 140. Since voltage levels of the external circuit may be different than voltage level of the monitor circuit 130, the voltage level shifting is used to adjust these levels to be compatible for proper operation. If there is no difference in the voltage level, the input level shifter 210 is not needed and the command signals may be passed directly to the control circuit 220, if the control circuit 220 is operated under Vccx. If the control circuit 220 is operated under Vcccore, then the input level shifter 210 can be used to convert the control circuit 220 outputs to the sensor circuit 230 and the comparator circuit 240.

The control circuit 220 generates control signals from command signals as shifted by the input level shifter 210. The control signals correspond to a programmable configuration that configures or sets up the sensor circuit 230 and the comparator circuit 240.

The sensor circuit 230 generates a ground reference (GR) signal and N power reference (PR) signals forming a ladder according to the programmable configuration provided by the control circuit 220, or the monitor controller 150. The GR signal tracks the device ground signal of the device 110 and the PR signals track the device power signal of the device 110. Tracking here means that the tracking signal follows the change in the tracked signal.

The comparator circuit 240 compares the GR signal with the N PR signals to provide N comparison output signals. The N comparison output signals indicate the position and the time that the GR signal moves across the ladder. By recording or observing the position and/or the time of the movement of the GR signal, numerous monitoring parameters may be obtained including AC and DC (Vcc–Vss) variations, undershoot and overshoot noises, slew rates, etc. The N comparison output signals may be made available to the monitor port 140 or other external device directly without going through the output encoder 250 and/or the output level shifter 260.

The output encoder 250 encodes the comparison output signals into encoded output signals. The encoded output signals provide the result of the monitoring for the configuration provided by the command signals. For example, the encoded output signals may provide the number of crossings by the GR signal across the PR ladder. When direct outputs are desired, the output encoder 250 may not be needed.

The output level shifter 260 shifts the voltage levels of the encoded output signals to the appropriate levels for compatibility with the device 110. It may not be needed if the voltage levels are already compatible.

Figure 3:
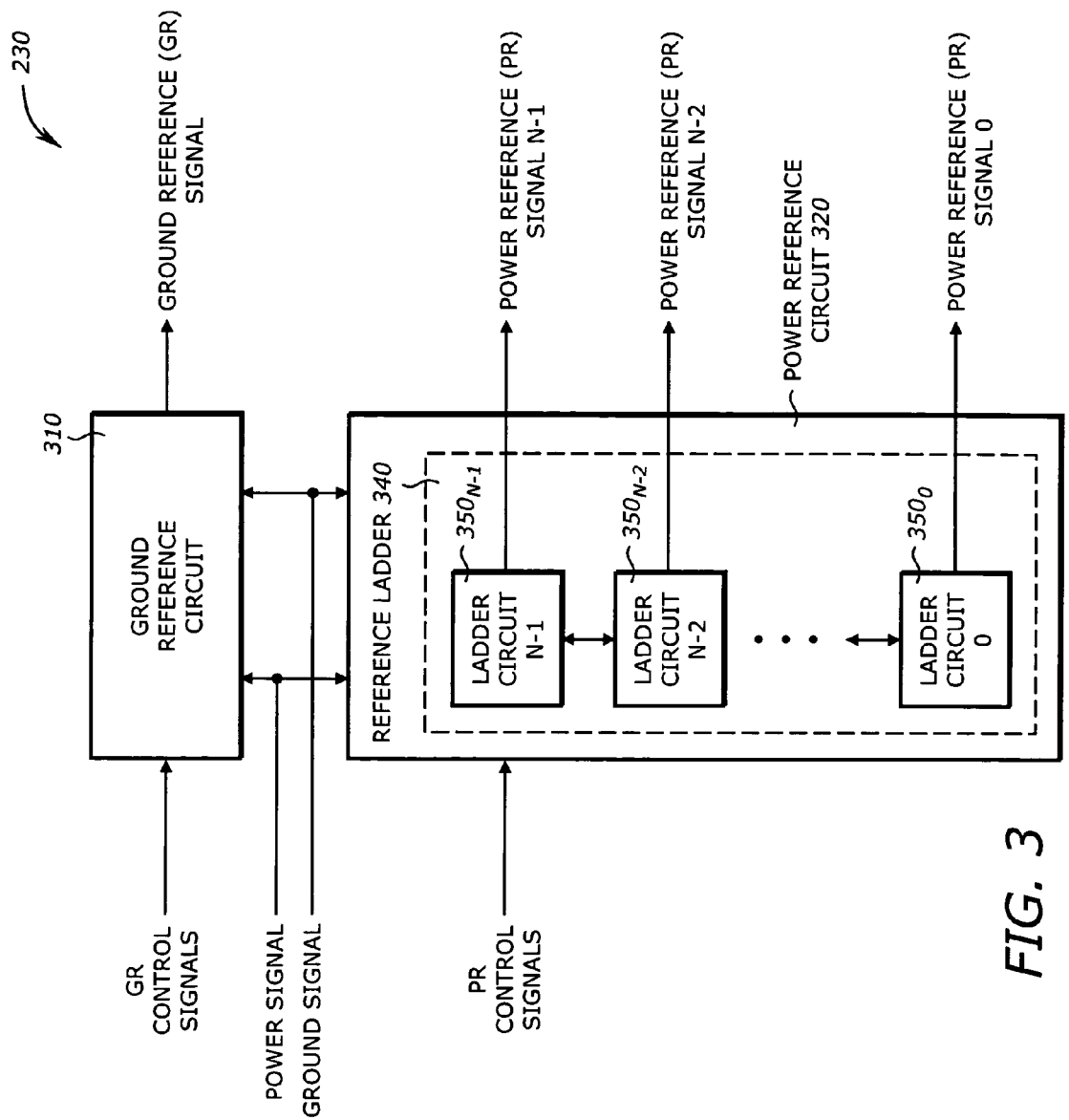
FIG. 3 is a diagram illustrating a sensor circuit according to one embodiment of the invention.

FIG. 3 is a diagram illustrating the sensor circuit 230 according to one embodiment of the invention. The sensor circuit 230 includes a ground reference (GR) circuit 310 and a power reference (PR) circuit 320. The sensor circuit 230 is controlled by the control circuit 220. The control signals may include GR control signals to control the GR circuit, PR control signals to control the PR circuit 320, and comparator control signals to control the comparator circuit 240.

The GR circuit 310 generates the GR signal according to the GR control signals from the control circuit 220. The GR control signals may include signals that specify the positioning of the GR signal in the PR reference ladder during a calibration or initialization procedure. The GR signal tracks the device ground signal.

The PR circuit 320 generates the N PR signals spaced at an effective ladder spacing (ELS) and occupying a PR range of the ladder. N may be any suitable positive integer. In one embodiment, N is an odd positive integer. The higher the value of N is, the finer the resolution of detection becomes or the wider the detection coverage range. In one embodiment, N is an odd integer ranging from 5 to 17. Typically, the ELS is approximately constant from one PR signal to the next PR signal. It is, however, contemplated that the ELS may be variable and programmable. The PR circuit 320 includes a reference ladder 340 that provides the N PR signals 0 to N–1. The reference ladder 340 includes N ladder circuits $350_0$ to $350_{N-1}$ corresponding to the N PR signals 0 to N–1, respectively. The N PR signals 0 to N–1 track the device power signal. The settings of the ladder circuits $350_0$ to $350_{N-1}$ may be controlled by the PR control signals provided by the control circuit 220 during a calibration or initialization procedure.

The ($V_{cc}$–$V_{ss}$) changes may be determined or calculated based on the value of the ELS and the number of crossings that the GR signal crosses the PR signals in the PR ladder. If the ELS is the same for the entire ladder, the difference in ($V_{cc}$–$V_{ss}$) may be determined as:

$$V_{cc}-V_{ss}=ELS*\text{number of crossings} \quad (1)$$

The ELS is the amount of the difference (Vcc–Vs) change needed for the GR signal to move up or down one ladder. This value has a low sensitivity with respect to various process skews and voltage variation. By calibrating the sensor circuit, the actual ELS of each ladder can be determined. As shown in equation (1), this difference is proportional to a product of the ELS and the number of crossings that the GR signal crosses the PR signals in the PR ladder. The minimum increment or decrement of the Vcc to achieve two consecutive ladder crossings is the ELS of that ladder. This value also takes into account the comparator offset. Therefore, this calibration procedure eliminates or reduces significantly the skews in different ladders and the related comparators introduced by process skews and variances, as well as layout mismatches. The result is that different ELS values, quantified by this procedure, can be assigned to different ladders to achieve maximum accuracy for each on-die monitor circuit.

Figure 4:
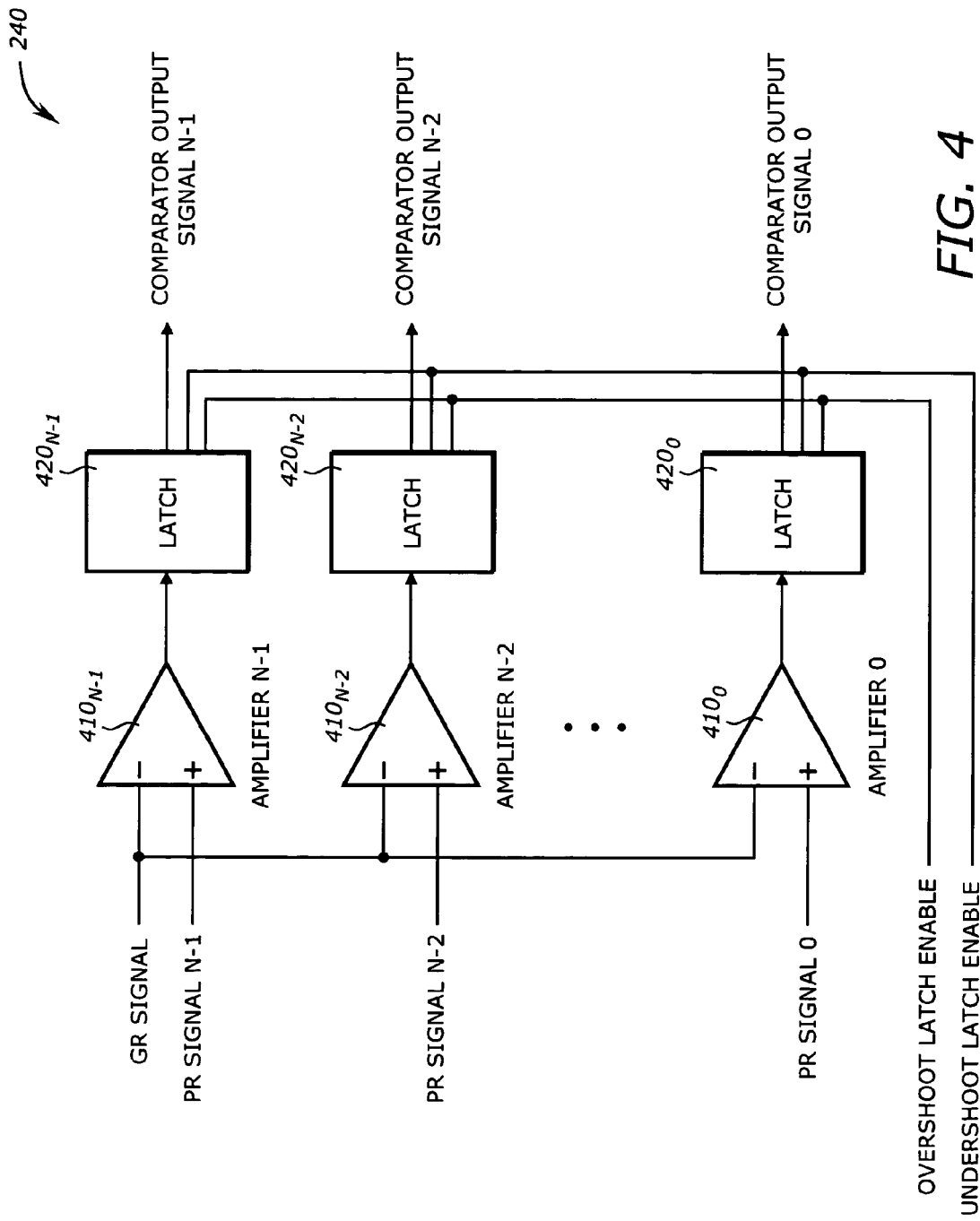
FIG. 4 is a diagram illustrating a comparator circuit according to one embodiment of the invention.

FIG. 4 is a diagram illustrating the comparator circuit 240 according to one embodiment of the invention. The comparator circuit 240 includes N amplifiers $410_0$ to $410_{N-1}$ and N latches $420_0$ to $420_{N-1}$. The N latches $420_0$ to $420_{N-1}$ are connected to respective N amplifiers $410_0$ to $410_{N-1}$. These latches can be either rising or falling edge triggered latches, enabled or disabled by the control circuit 220.

Each of the N amplifiers $410_0$ to $410_{N-1}$ compares the GR signal with one of the PR signals 0 to N–1 and converts the comparison result signal to a digital logic level indicating whether the GR signal is lower or higher than the respective PR signal.

Each of the latches $420_0$ to $420_{N-1}$ is controlled by an overshoot latch enable signal and an undershoot latch enable signal from the control circuit 220 to latch the respective digital comparison result signals from the N amplifiers $410_0$ to $410_{N-1}$. When the corresponding latch is enabled, the comparison result signal is latched and stays during the latching time. When the corresponding latch is disabled, it becomes transparent and the comparison output signal k follows the comparison result signal k. Disabling the latches allows continuous monitoring the changes of the GR signal with respect to the PR ladder. Enabling the latches allows capturing or taking a snapshot of the changes of the GR signal at a particular time instant with respect to the PR ladder.

Figure 5:
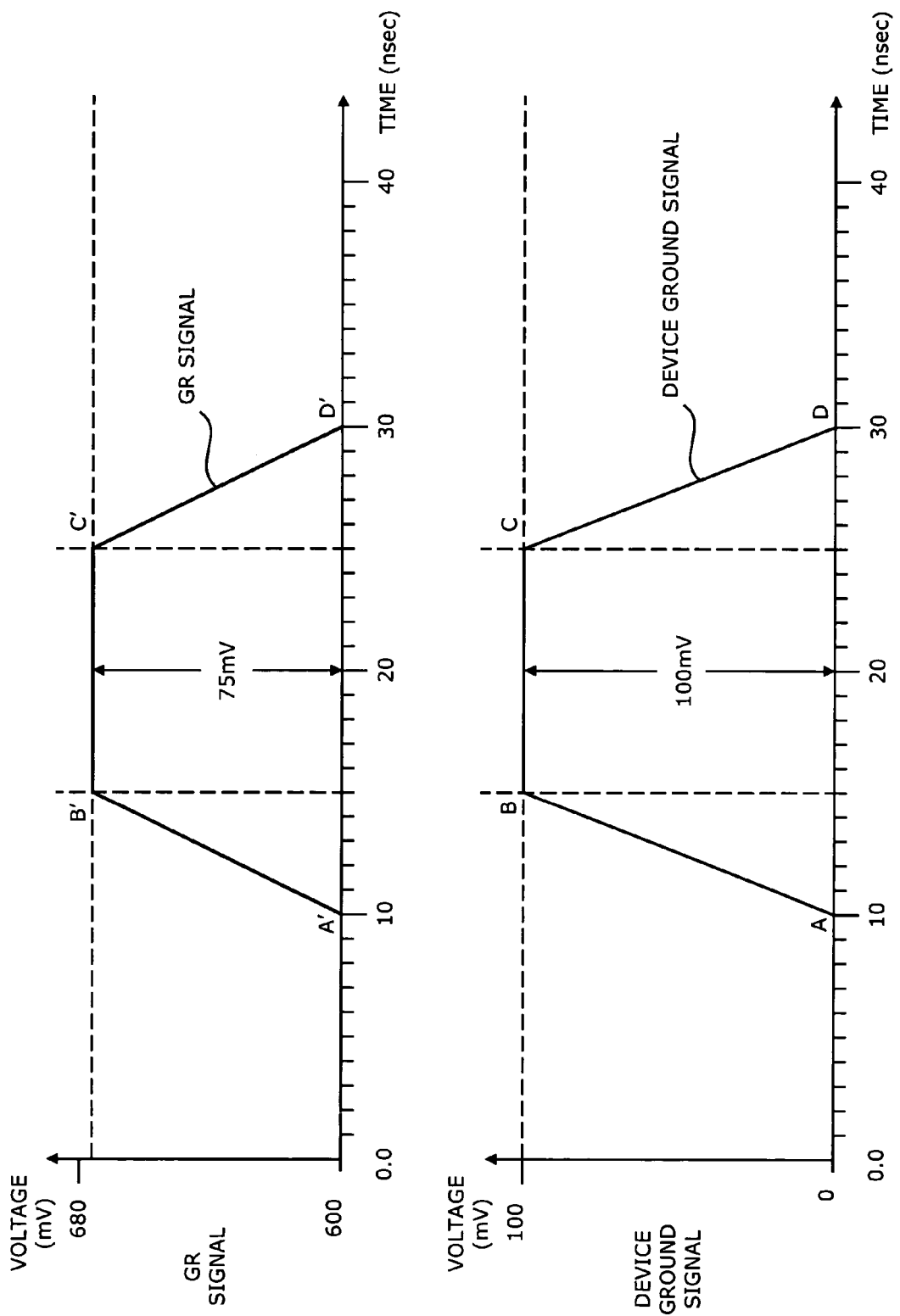
FIG. 5 is a diagram illustrating the ground reference signal tracking the device ground signal according to one embodiment of the invention.

FIG. 5 is a diagram illustrating the ground reference signal tracking the device ground signal according to one embodiment of the invention.

In this illustrative example, the device ground signal has a characteristic shown as consisting of three segments AB, BC, and CD. This characteristic shows that the device ground signal has a movement of 100 mV. The GR signal tracks the device ground signal through the characteristic formed by the segments A'B', B'C', and C'D'. In this illustrative example, the GR signal has a movement of 75 mV.

Figure 6:
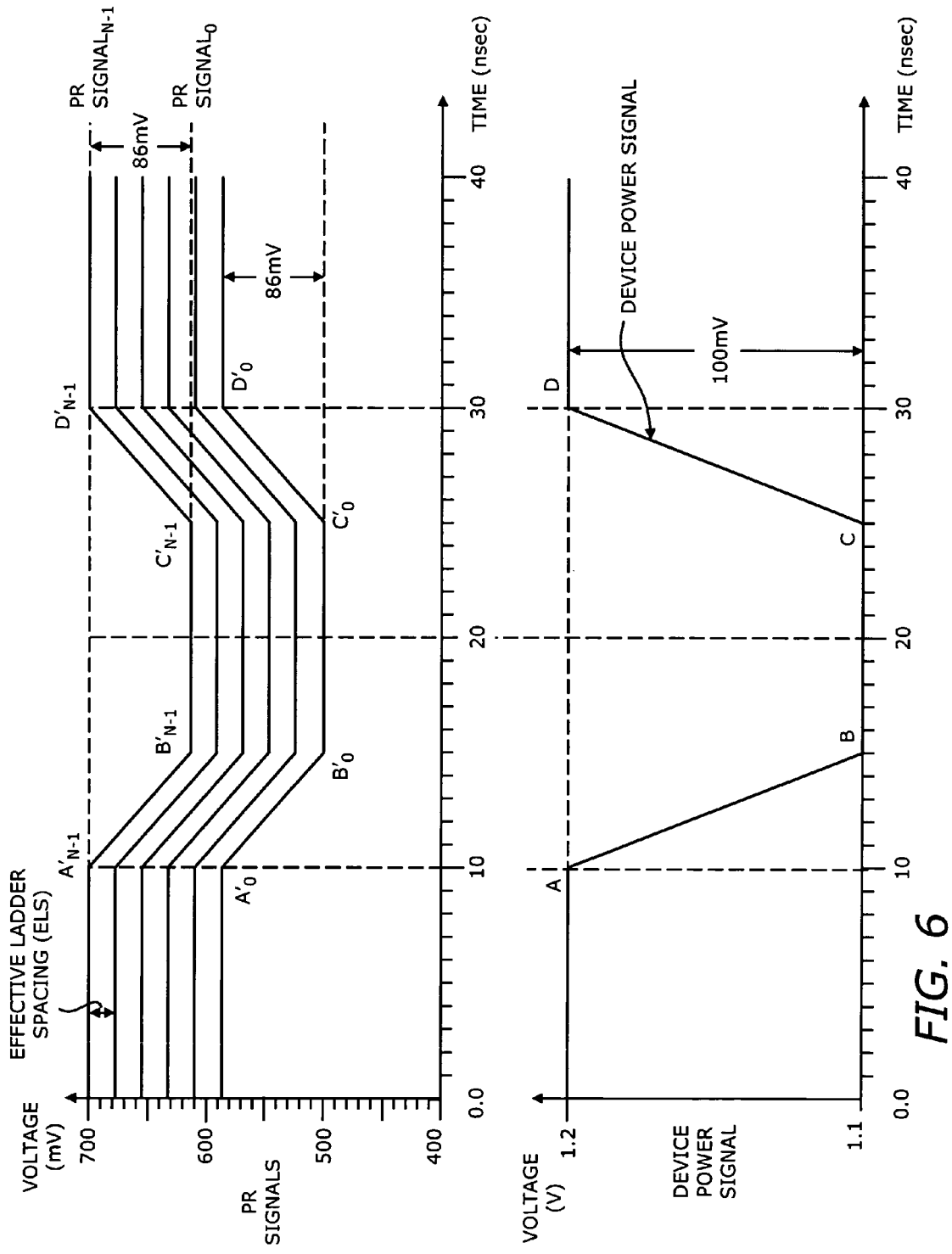
FIG. 6 is a diagram illustrating power reference signals tracking device power signal according to one embodiment of the invention.

FIG. 6 is a diagram illustrating power reference signals tracking device power signal according to one embodiment of the invention.

In this illustrative example, the device power signal has a characteristic consisting of three segments AB, BC, and CD. This characteristic shows that the device power signal has a movement of 100 mV. The PR signals track the device power signal through N characteristics forming a ladder. For example, the characteristic for the PR signal k (k=0, . . . , N–1) has three segments $A'_kB'_k$, $B'_kC'_k$, and $C'_kD'_k$ corresponding to the segments AB, BC, and CD, respectively. Typically, the N PR signals 0 to N–1 follow the device power signal approximately uniformly. In other words, the characteristics of the N PR signals 0 to N–1 form N parallel curves. In this illustrative example, the characteristics of the N PR signals have a movement of approximately 86 mV.

The effective ladder spacing (ELS) is the difference between the voltage levels of consecutive PR signals. As discussed before, the ELS is typically constant for the entire ladder. However, it may be made variable.

Figure 7:
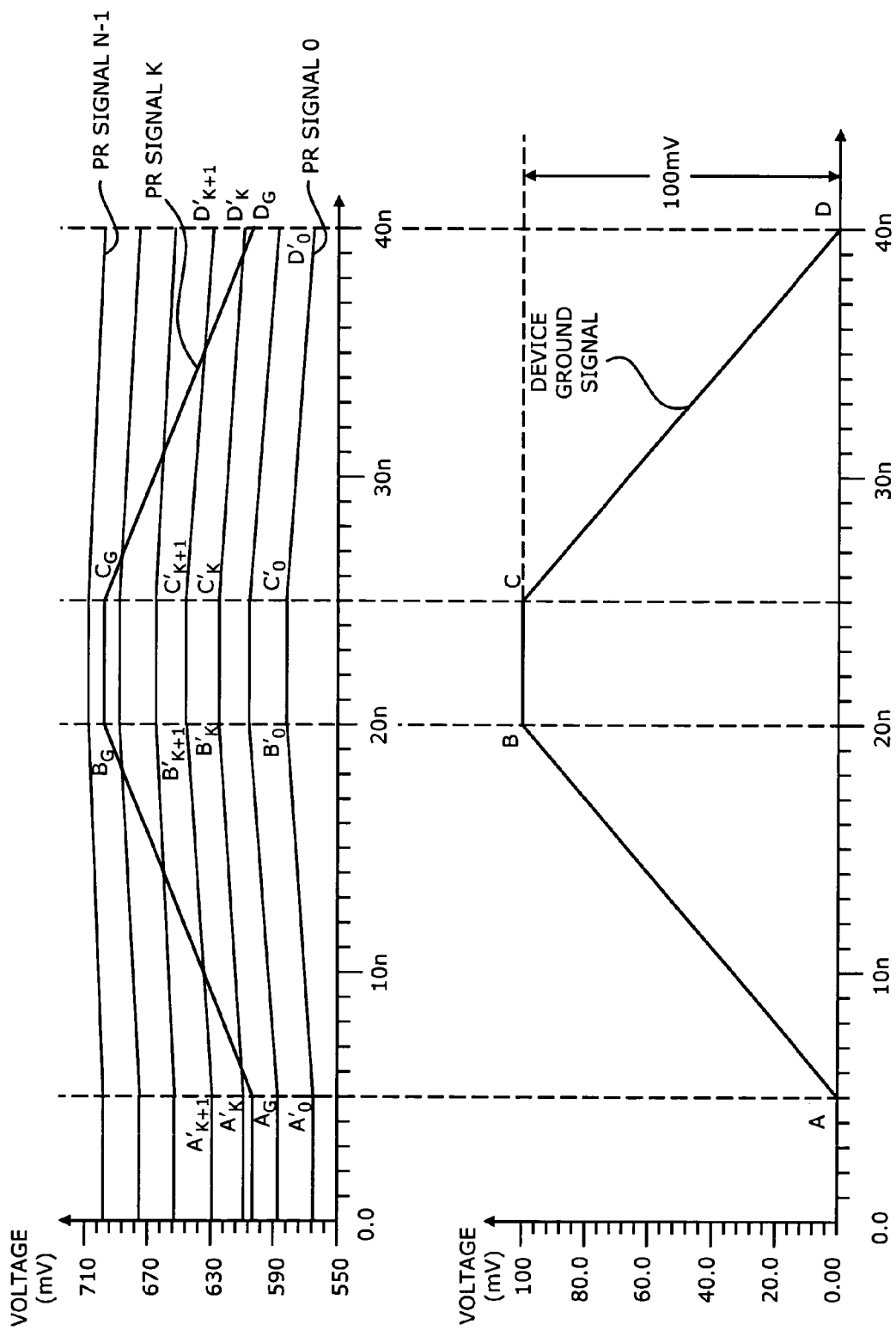
FIG. 7 is a diagram illustrating ground noise as detected by the sensor circuit according to one embodiment of the invention.

FIG. 7 is a diagram illustrating ground noise as detected by the sensor circuit according to one embodiment of the invention.

In this illustrative example, the device ground signal exhibits a ground noise behavior and has a characteristic formed by three segments AB, BC, and CD. The characteristic has a movement of 100 mV from point A to point B.

When there is a ground noise, typically the GR signal follows the ground noise signal more dominantly than the PR signals. When the GR signal is observed together with the PR signals, its variation with respect to the PR signals indicates the variation of the device power signal and the device ground signal, or $(V_{cc}-V_{ss})$. The degree of variation is dictated or determined by the number of crossings that the GR signal crosses the PR signals within the PR ladder. In this illustrative example, the GR signal follows the device ground noise in three segments $A'_G B'_G$, $B'_G C'_G$, and $C'_G D'_G$ corresponding to the segments AB, BC, and CD, respectively. Similarly, the PR signals 0 to N−1 follow the device ground noise slightly. The PR signal k has the three segments $A'_k B'_k$, $B'_k C'_k$, and $C'_k D'_k$ corresponding to the segments AB, BC, and CD, respectively. The GR signal crosses four PR signals within the PR ladder or four ELS's.

Figure 8:
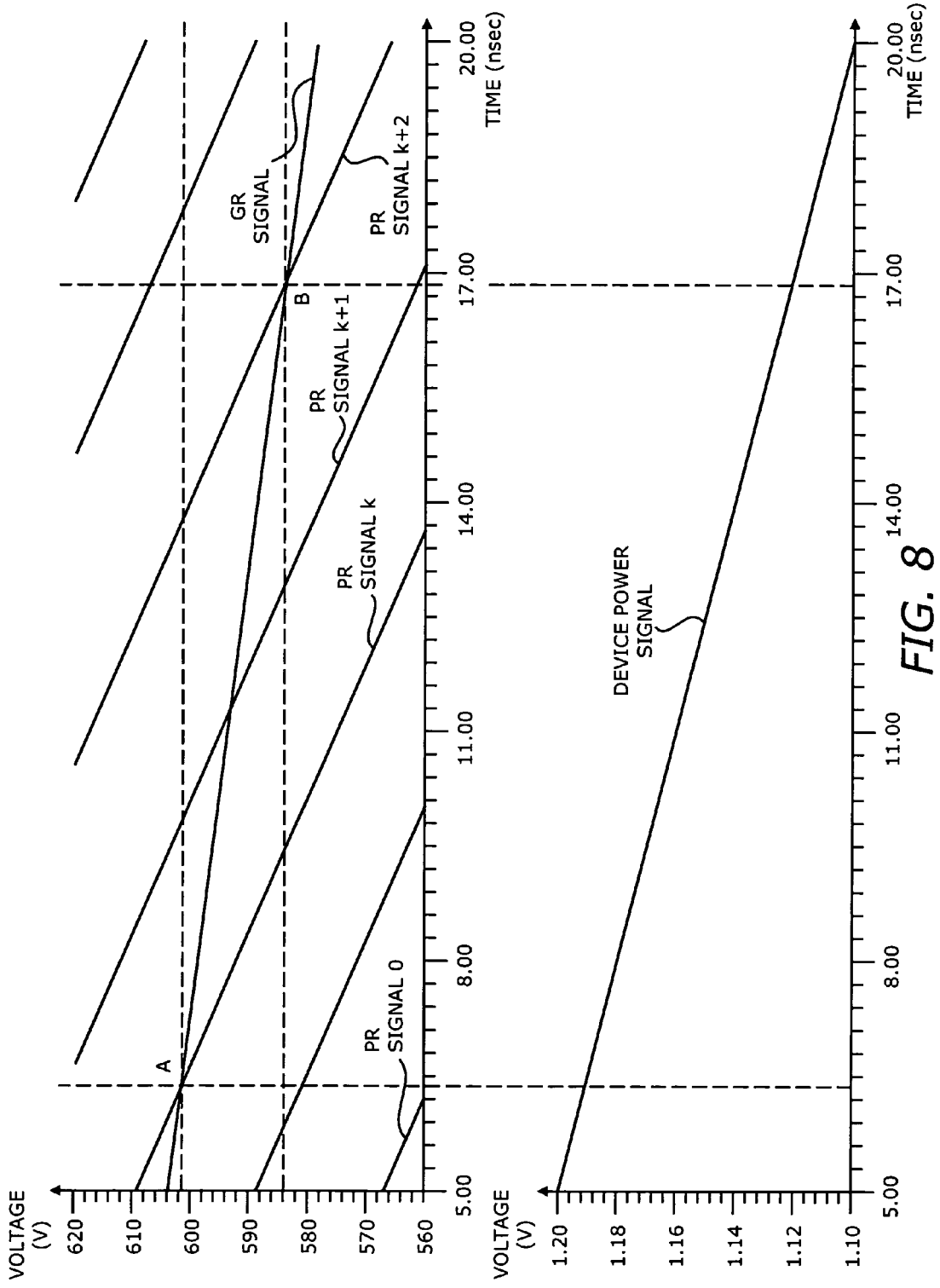
FIG. 8 is a diagram illustrating power noise as detected by the sensor circuit according to one embodiment of the invention.

FIG. 8 is a diagram illustrating power noise as detected by the sensor circuit according to one embodiment of the invention.

In this illustrative example, the device power signal drops from 1.2 V to 1.1 V, corresponding to a 100 mV power noise.

When there is a power noise, typically the PR signals follow the device power signal more dominantly than the GR signal. When the GR signal is observed together with the PR signals, its variation with respect to the PR signals indicates the variation of the device power signal and the device ground signal, or $(V_{cc}-V_{ss})$. The degree of variation is dictated or determined by the number of crossings that the GR signal crosses the PR signals within the PR ladder. In this illustrative example, the GR signal crosses three PR signals within the PR ladder or three ELS's.

Figure 9:
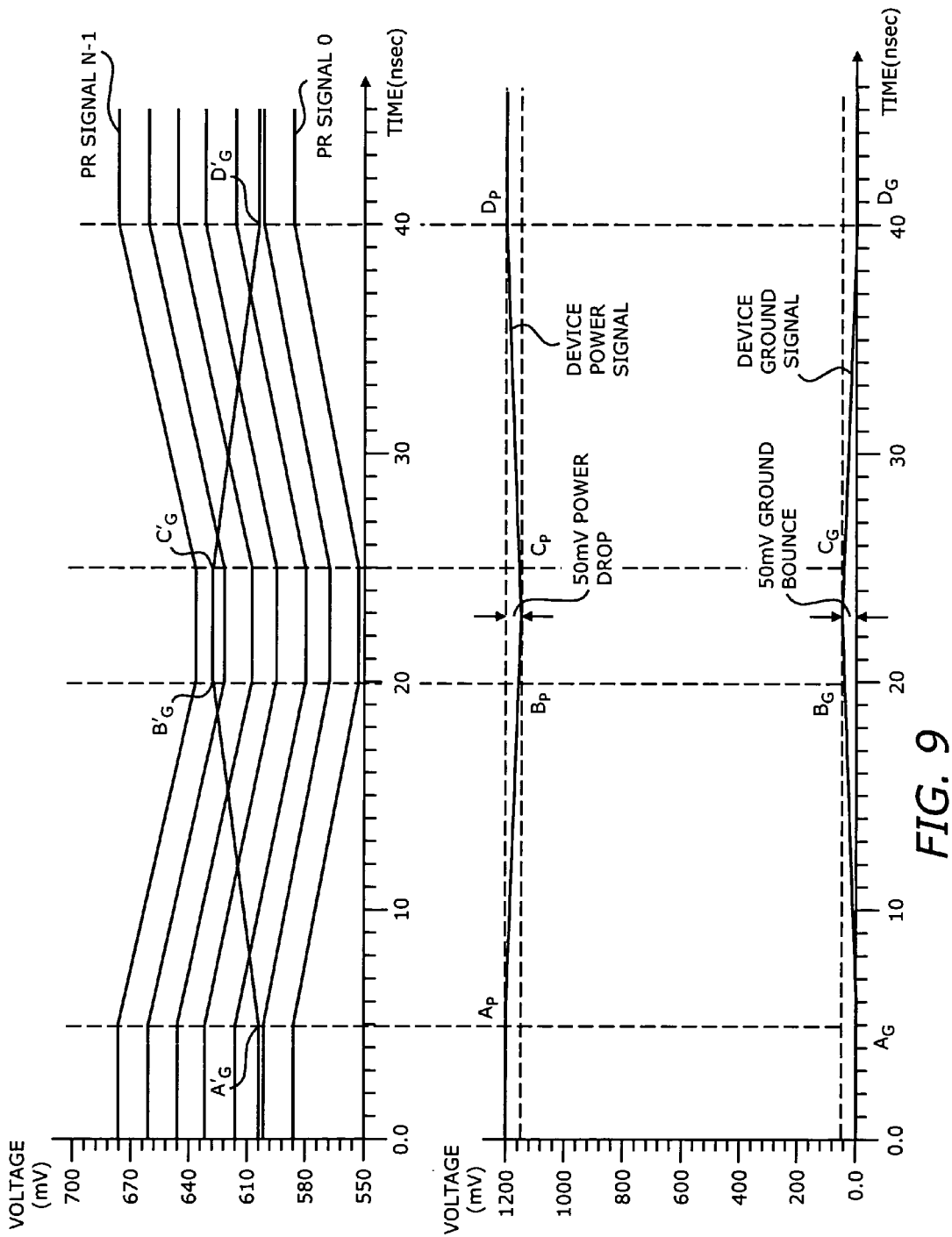
FIG. 9 is a diagram illustrating voltage drop as detected by the sensor circuit according to one embodiment of the invention.

FIG. 9 is a diagram illustrating voltage drop as detected by the sensor circuit according to one embodiment of the invention.

In this illustrative example, there are ground bounce and power voltage drop. The device ground signal has a characteristic consisting of three segments $A_G B_G$, $B_G C_G$, and $C_G D_G$, showing a 50 mV ground bounce. The device power signal has a characteristic consisting of three segments $A_P B_P$, $B_P C_P$, and $C_P D_P$, showing a 50 mV IR drop.

The GR signal track the device ground signal and the PR signals track the device power signal. The combination of these tracking signals shows a 100 mV undershoot. The GR signal has a characteristic consisting of three segments $A'_G B'_G$, $B'_G C'_G$, and $C'_G D'_G$ corresponding to the three segments $A_G B_G$, $B_G C_G$, and $C_G D_G$, respectively. The GR signal crosses 4 PR signals corresponding to four ELS's. For a pre-identified ELS of approximately 24 mV, this corresponds to 96 mv undershoot measurement, well matching the 100 mv actual value.

Figure 10:
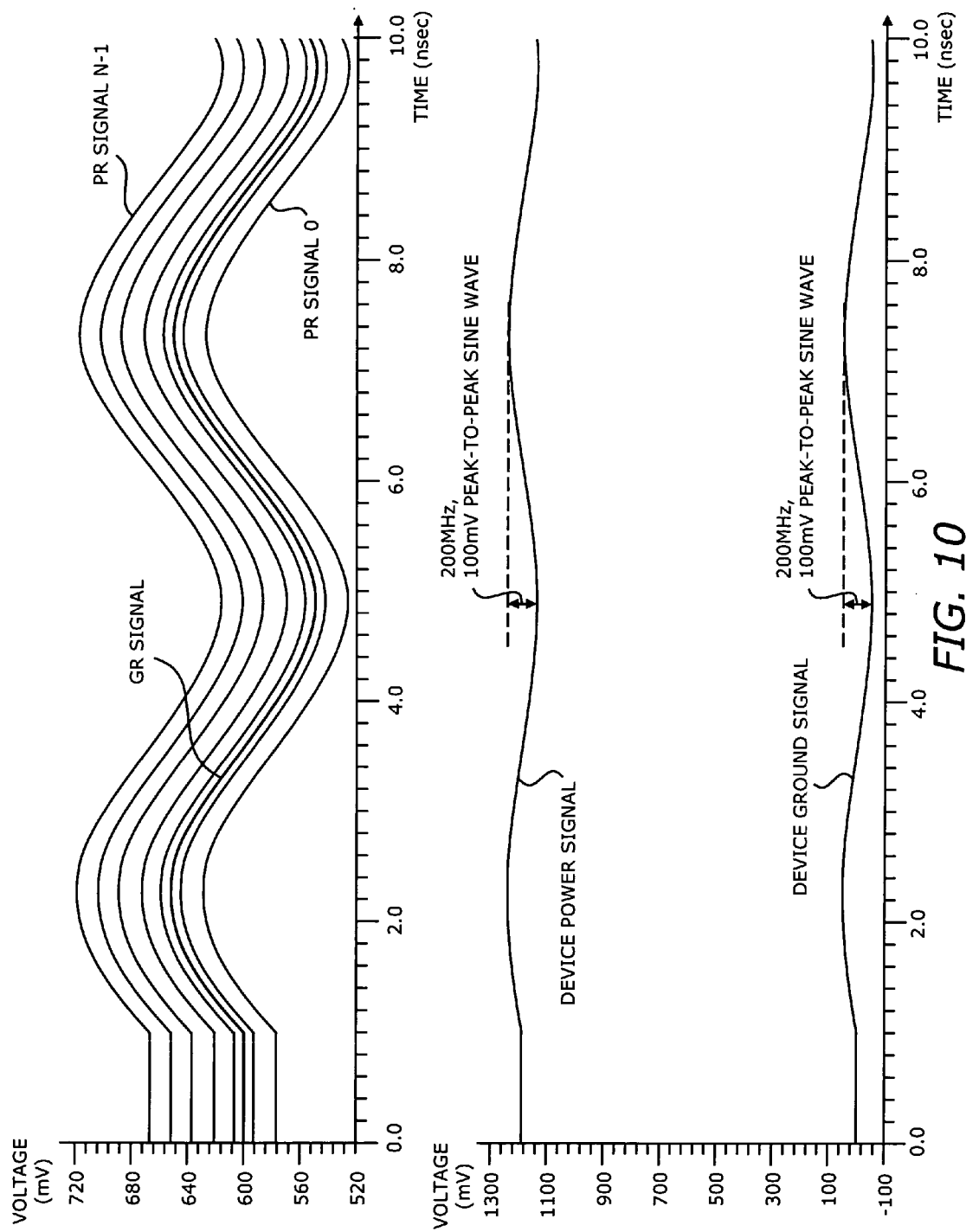
FIG. 10 is a diagram illustrating AC in-phase noise as detected by the sensor circuit according to one embodiment of the invention.

FIG. 10 is a diagram illustrating AC in-phase noise as stimulus to validate the sensor circuit according to one embodiment of the invention.

The device ground signal exhibits a sine wave noise characteristic at 200 MHz with 100 mV peak-to-peak voltage. The device power signal exhibits the same behavior. The two sine waves are in-phase. The GR signal and the PR signals track the device ground signal and the device power signal, respectively. Since the device ground signal is in-phase with the device power signal, the GR signal is also in-phase with the PR signals. Therefore it does not cross any of the PR signals in the ladder. The AC difference of the device power signal and the ground signal, i.e., $(V_{cc}-V_{ss})$, is therefore approximately zero. The monitor circuit has no detection, because there is no change in (Vcc−Vss).

Figure 11:
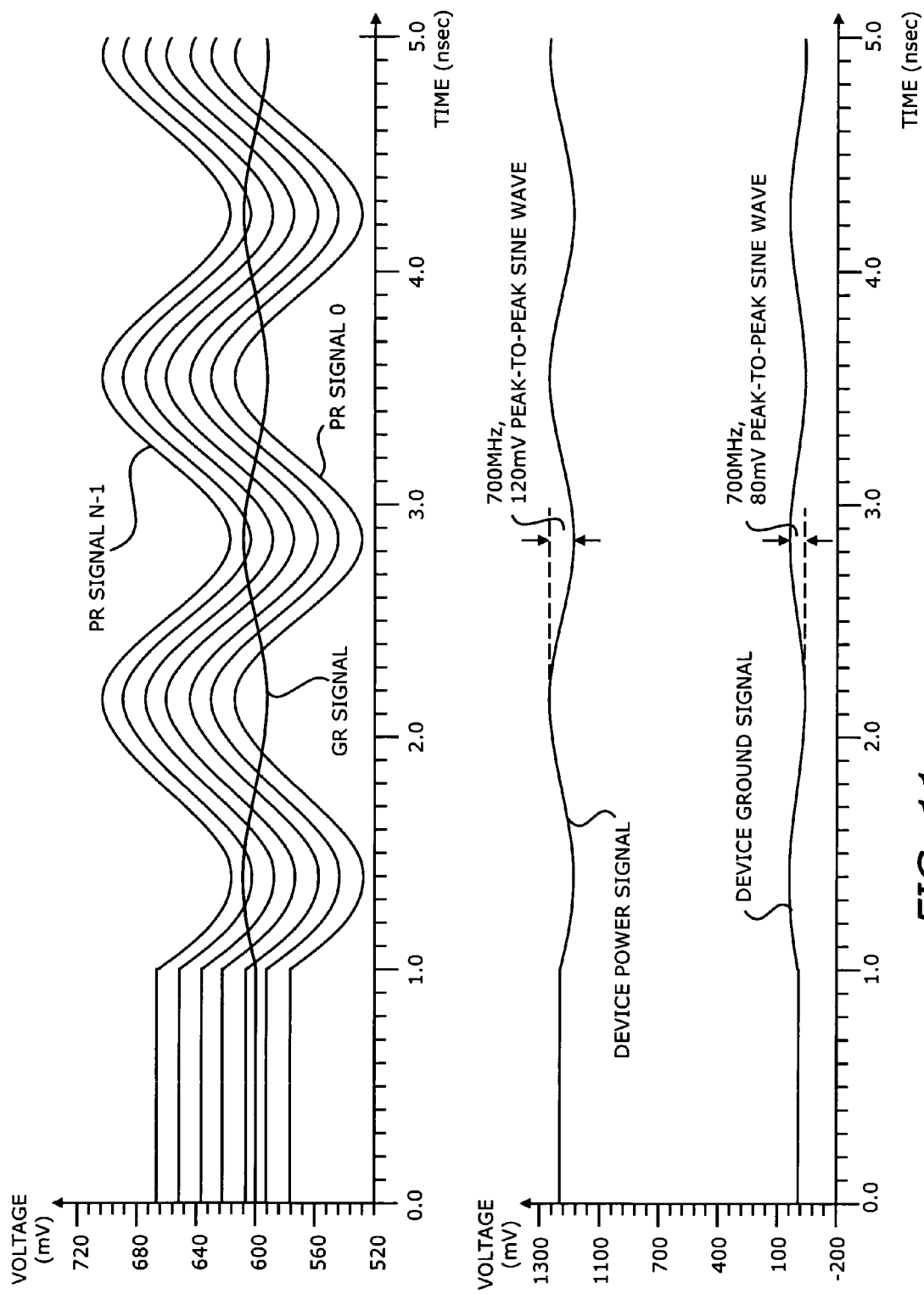
FIG. 11 is a diagram illustrating AC out-of-phase noise as detected by the sensor circuit according to one embodiment of the invention.

FIG. 11 is a diagram illustrating AC opposite-phase noise as stimulus to validate the sensor circuit according to one embodiment of the invention.

The device ground signal exhibits a sine wave noise characteristic at 700 MHz with 80 mV peak-to-peak voltage. The device power signal exhibits a sine wave noise characteristic at 700 MHz, 120 mV peak-to-peak voltage and is opposite-phase with the ground noise characteristic. Therefore, the maximum undershoot is 100 mv. The GR signal and the PR signals track the device ground signal and the device power signal, respectively. Since the device ground signal is opposite-phase with the device power signal, the GR signal is also opposite-phase with the PR signals. For an ELS of approximately 24 mV, this 96 mv measurement corresponds to the approximately 100 mV undershoot.

Figure 12:
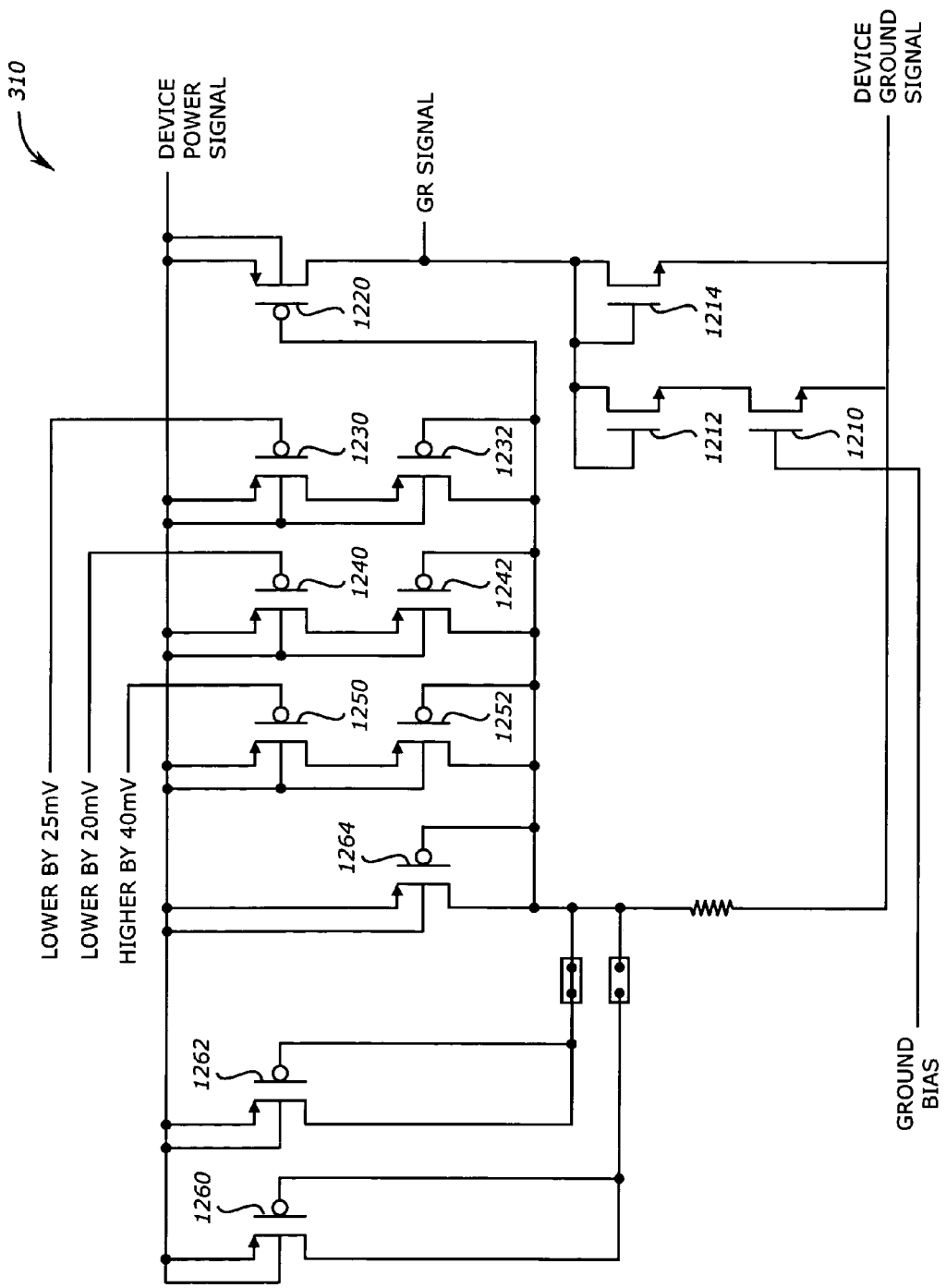
FIG. 12 is a diagram illustrating a ground reference circuit according to one embodiment of the invention.

FIG. 12 is a diagram illustrating the ground reference circuit 310 according to one embodiment of the invention. The GR circuit 310 includes several transistors to generate the GR signal.

Transistors 1210, 1212, and 1214 together form a ground bias for the GR signal. The GR control signals include a ground bias control signal to transistor 1210 to introduce an offset or bias to the GR signal with respect to the device ground signal. The GR control signals also include three control signals to introduce additional biases to the GR signal with respect to the device power signal. For example, the GR control signal GR0 lowers the GR signal by 25 mV by controlling transistors 1230 and 1232. The GR control signal GR1 lowers the GR signal by 20 mV by controlling transistors 1240 and 1242. The GR control signal GR2 increases the GR signal by 40 mV by controlling transistors 1250 and 1252.

Additional transistors may be used to provide more control on positioning the GR signal with respect to the PR ladder. By providing bias control to the GR signal, the GR signal can be programmed to adjust its position with respect to the PR ladder to compensate for process skew and adjust the detection coverage.

Figure 13:
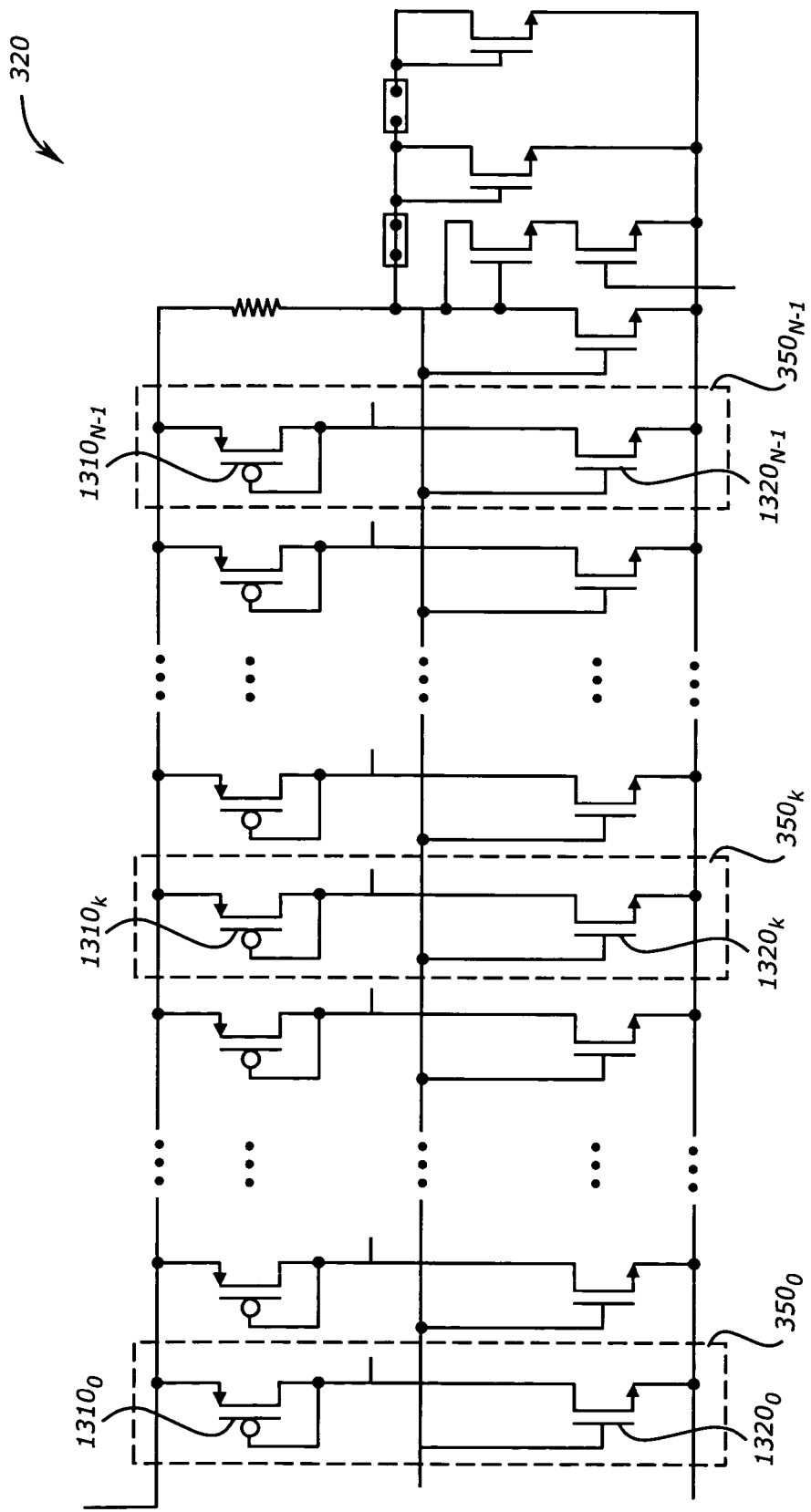
FIG. 13 is a diagram illustrating a power reference circuit according to one embodiment of the invention.

FIG. 13 is a diagram illustrating the power reference circuit according to one embodiment of the invention. In this illustrative example, N ladder circuits $350_0$ to $350_{N-1}$ are used to provide N PR signals forming a reference ladder. Each ladder circuit includes two transistors with almost identical operation. For example, the ladder circuit $350_k$ includes transistor $1310_k$ connected to the device power signal and transistor $1320_k$ connected to the device ground signal. The transistor $1310_k$ provides a negative bias with respect to the power signal and the transistor $1320_k$ provides a positive bias with respect to the device ground signal. The transistors $1310_k$'s (K=0, ..., N−1) and the transistors $1320_k$'s (k=0, ..., N−1) are sized, so that the PR signals are spaced with approximately equal ELS. The strengths of the transistors $1310_k$'s (k=0, ..., N−1) and the transistors $1320_k$'s (k=0, ..., N−1) can be made adjustable with optional control signal, so that the ELS of the PR ladder can be made programmable.

Control signals may be used to provide control on positioning the PR signals. For example, additional transistors may be included to pull up or pull down the PR signals. The amount of pull-up or pull-down may be fixed. PR control signals may then be used to turn on or turn off the pull-up or pull-down amount to effectuate the positioning of the underlying PR signal.

Figure 14:
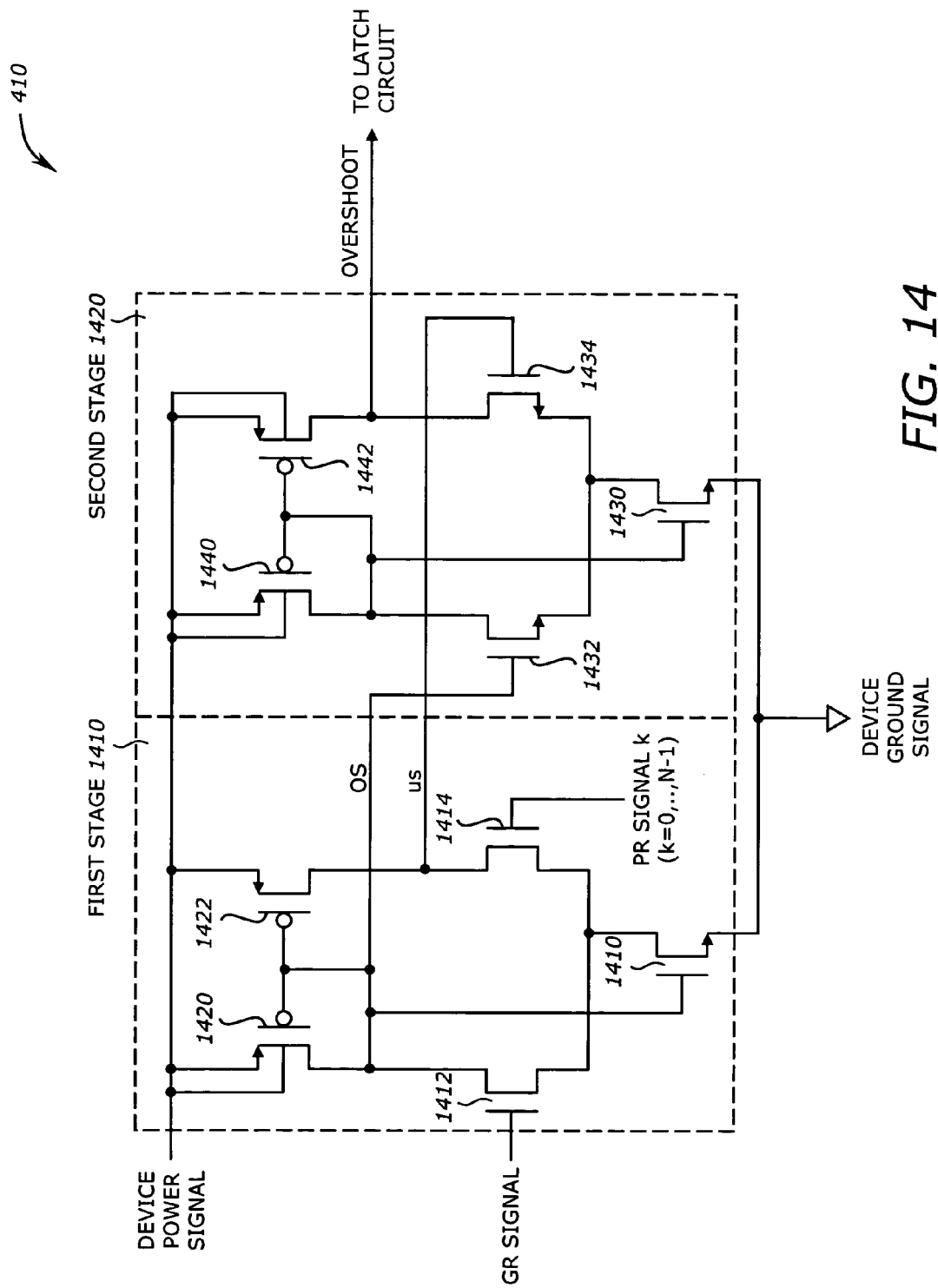
FIG. 14 is a diagram illustrating an amplifier circuit in the comparator circuit according to one embodiment of the invention.

FIG. 14 is a diagram illustrating the amplifier circuit 410 in the comparator circuit according to one embodiment of the invention. The amplifier circuit 410 includes a first stage 1410 and a second stage 1420.

The first stage 1410 includes a differential amplifier formed by 5 transistors 1410, 1412, 1414, 1420, and 1422. The inputs to the first stage 1410 are the GR signal and the PR signal k (k=0, . . . , N−1). The first stage 1410 generates two outputs OS and US which are used as inputs to the second stage 1420.

The second stage 1420 includes a differential amplifier formed by 5 transistors 1430, 1432, 1434, 1440, and 1442 in a similar manner as in the first stage 1410. The second stage 1420 generates an overshoot signal which indicates if the GR signal is lower than the PR signal k. The overshoot signal represents the comparison result signal which goes to the corresponding latch circuit.

Figure 15:
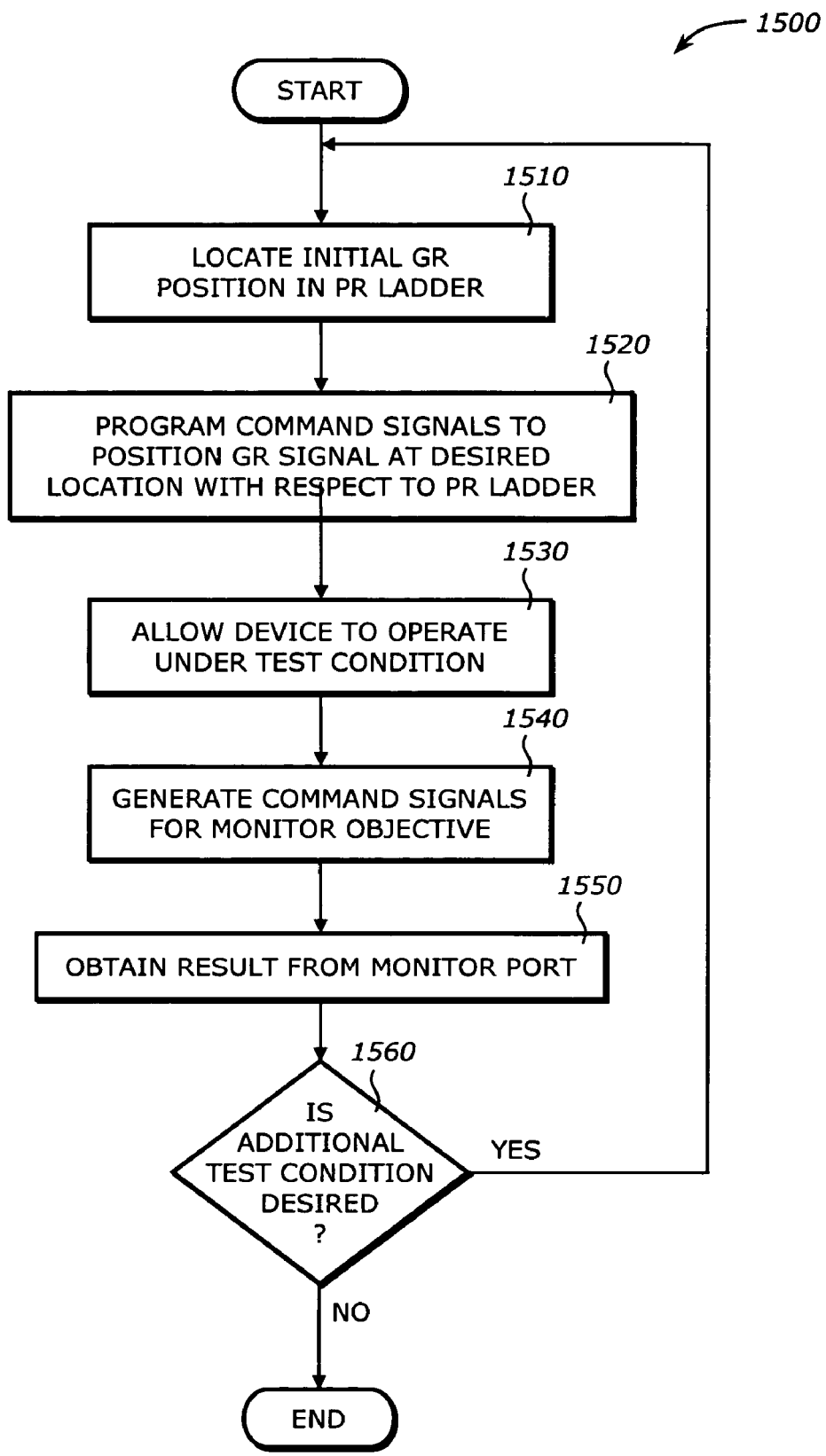
FIG. 15 is a flowchart illustrating a process to control monitoring the device according to one embodiment of the invention.

FIG. 15 is a flowchart illustrating a process 1500 to control monitoring the device according to one embodiment of the invention. The process 1500 is typically performed by the monitor controller 150 shown in FIG. 1.

Upon START, the process 1500 calibrates the device having an on-die monitor circuit. This includes locating the initial GR position in the PR ladder (Block 1510). This can be done by powering the device and the monitor circuit with default values. Next, the process 1500 programs the command signals to position the GR signal at a desired position with respect to the PR ladder (Block 1520). Then, the process 1500 allows the device to operate under a test condition (Block 1530). The test condition may include enabling a section of the core device, operating the device at various operating frequencies, or injecting noise to the power or ground, or any other suitable test condition.

Next, the process 1500 generates the command signals for a monitor objective (Block 1540). A monitor objective may be any of the intended monitor tasks such as enabling the monitor circuit, enabling the latch circuit, etc. Then, the process 1500 obtains the result from the monitor port (Block 1550). The monitor port may include the outputs of the output encoder, the outputs of the comparator circuit, etc. Next, the process 1500 determines if additional test is needed (Block 1560). If so, the process 1500 returns to Block 1510. Otherwise, it is terminated.

Elements of one embodiment of the invention may be implemented by hardware, firmware, software or any combination thereof. The term hardware generally refers to an element having a physical structure such as electronic, electromagnetic, optical, electro-optical, mechanical, electromechanical parts, etc. The term software generally refers to a logical structure, a method, a procedure, a program, a routine, a process, an algorithm, a formula, a function, an expression, etc. The term firmware generally refers to a a logical structure, a method, a procedure, a program, a routine, a process, an algorithm, a formula, a function, an expression, etc. that is implemented or embodied in a hardware structure (e.g., flash memory, read only memory, erasable read only memory). Examples of firmware may include microcode, writable control store, micro-programmed structure. When implemented in software or firmware, the elements of an embodiment of the present invention are essentially the code segments to perform the necessary tasks. The software/firmware may include the actual code to carry out the operations described in one embodiment of the invention, or code that emulates or simulates the operations. The program or code segments can be stored in a processor or machine accessible medium or transmitted by a computer data signal embodied in a carrier wave, or a signal modulated by a carrier, over a transmission medium. The "processor readable or accessible medium" or "machine readable or accessible medium" may include any medium that can store, transmit, or transfer information. Examples of the processor readable or machine accessible medium include an electronic circuit, a semiconductor memory device, a read only memory (ROM), a flash memory, an erasable ROM (EROM), a floppy diskette, a compact disk (CD) ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc. The machine accessible medium may be embodied in an article of manufacture. The machine accessible medium may include data that, when accessed by a machine, cause the machine to perform the operations described above. The machine accessible medium may also include program code embedded therein. The program code may include machine readable code to perform the operations described above. The term "data" here refers to any type of information that is encoded for machine-readable purposes. Therefore, it may include program, code, data, file, etc.

All or part of an embodiment of the invention may be implemented by hardware, software, or firmware, or any combination thereof. The hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
a sensor circuit to generate a ground reference (GR) signal and N power reference (PR) signals forming a ladder according to a programmable configuration, the GR signal tracking a device ground signal of a device and the PR signals tracking a device power signal of the device; and
a comparator circuit coupled to the sensor circuit to compare the GR signal with the N PR signals to provide N comparison output signals, the N comparison output signals indicating position and time that the GR signal moves across the ladder.

2. The apparatus of claim 1 further comprising:
a control circuit coupled to the sensor circuit to generate control signals from command signals, the control signals corresponding to the programmable configuration.

3. The apparatus of claim 1 further comprising:
an output encoder coupled to the comparator circuit to encode the comparison output signals into encoded output signals.

4. The apparatus of claim 2 further comprising:
an input level shifter coupled to the control circuit to shift voltage level of the command signals.

5. The apparatus of claim 3 further comprising:
an output level shifter coupled to the output encoder to shift voltage level of the encoded output signals.

6. The apparatus of claim 1 wherein the sensor circuit comprises:
a PR circuit to generate the N PR signals spaced at an effective ladder spacing (ELS) and occupying a PR range of the ladder; and
a GR circuit to generate the GR signal.

7. The apparatus of claim 6 wherein the comparator circuit comprises:
N amplifiers coupled to the PR circuit and the GR circuit to compare each of the N PR signals with the GR signal to generate N comparison result signals; and
N latch circuits coupled to the N amplifiers to convert the N comparison result signals into the N comparison output signals, the N comparison output signals being latched when the N latch circuits are latch enabled.

8. The apparatus of claim 6 wherein the difference between the device power signal and the device ground signal is proportional to a product of the ELS and number of crossings made by the GR signal while moving across the ladder.

9. The apparatus of claim 6 wherein the ELS is determined in a calibration procedure that adjusts the device power signal to achieve two consecutive crossings of the GR signal in the ladder.

10. The apparatus of claim 8 wherein the difference indicates one of an alternating current (AC) power overshoot, an AC power undershoot, and a voltage drop.

11. A method comprising:
generating a ground reference (GR) signal and N power reference (PR) signals forming a ladder using a sensor circuit according to a programmable configuration, the GR signal tracking a device ground signal of a device and the PR signals tracking a device power signal of the device; and
comparing the GR signal with the N PR signals using a comparator circuit to provide N comparison output signals, the N comparison output signals indicating position and time that the GR signal moves across the ladder.

12. The method of claim 11 further comprising:
generating control signals from command signals using a control circuit, the control signals corresponding to the programmable configuration.

13. The method of claim 11 further comprising:
encoding the comparison output signals into encoded output signals using an output encoder.

14. The method of claim 12 further comprising:
shifting voltage level of the command signals using an input level shifter.

15. The method of claim 13 further comprising:
shifting voltage level of the encoded output signals using an output level shifter.

16. The method of claim 11 wherein generating the GR signal and the N PR signals comprises:
generating the N PR signals spaced at an effective ladder spacing (ELS) and occupying a PR range of the ladder using a PR circuit; and
generating the GR signal using a GR circuit.

17. The method of claim 16 wherein comparing comprises:
comparing each of the N PR signals with the GR signal using N amplifiers to generate N comparison result signals; and
converting the N comparison result signals into the N comparison output signals using N latch circuits, the N comparison output signals being latched when the N latch circuits are latch enabled.

18. The method of claim 16 wherein the difference between the device power signal and the device ground signal is proportional to a product of the ELS and number of crossings made by the GR signal while moving across the ladder.

19. The method of claim 16 wherein the ELS is determined in a calibration procedure that adjusts the device power signal to achieve two consecutive crossings of the GR signal in the ladder.

20. The method of claim 18 wherein the difference indicates one of an alternating current (AC) power overshoot, an AC power undershoot, and a voltage drop.

21. A system comprising:
a monitor controller to control monitoring power behavior; and
a device coupled to the monitor controller having the power behavior, the device comprising:
a core circuit having device ground signal and device power signal, and
an on-die monitoring circuit coupled to the core circuit to monitor the device ground and power signals, the on-die monitor circuit comprising:
a sensor circuit to generate a ground reference (GR) signal and N power reference (PR) signals forming a ladder according to a programmable configuration, the GR signal tracking the device ground signal and the PR signals tracking the device power signal, and
a comparator circuit coupled to the sensor circuit to compare the GR signal with the N PR signals to provide N comparison output signals, the N comparison output signals indicating position and time that the GR signal moves across the ladder.

22. The system of claim 21 wherein the monitor circuit further comprises:

a control circuit coupled to the sensor circuit to generate control signals from command signals from the monitor controller, the control signals corresponding to the programmable configuration.

23. The system of claim 21 wherein the monitor circuit further comprises:
an output encoder coupled to the comparator circuit to encode the comparison output signals into encoded output signals.

24. The system of claim 22 wherein the monitor circuit further comprises:
an input level shifter coupled to the control circuit to shift voltage level of the command signals.

25. The system of claim 23 wherein the monitor circuit further comprises:
an output level shifter coupled to the output encoder to shift voltage level of the encoded output signals.

26. The system of claim 21 wherein the sensor circuit comprises:
a PR circuit to generate the N PR signals spaced at an effective ladder spacing (ELS) and occupying a PR range of the ladder; and
a GR circuit to generate the GR signal.

27. The system of claim 26 wherein the comparator comprises:
N amplifiers coupled to the PR circuit and the GR circuit to compare each of the N PR signals with the GR signal to generate N comparison result signals; and
N latch circuits coupled to the N amplifiers to convert the N comparison result signals into the N comparison output signals, the N comparison output signals being latched when the N latch circuits are latch enabled.

28. The system of claim 26 wherein the difference between the device power signal and the device ground signal is proportional to a product of the ELS and number of crossings made by the GR signal while moving across the ladder.

29. The system of claim 26 wherein the ELS is determined in a calibration procedure that adjusts the device power signal to achieve two consecutive crossings of the GR signal in the ladder.

30. The system of claim 28 wherein the difference indicates one of an alternating current (AC) power overshoot, an AC power undershoot, and a voltage drop.

* * * * *